(12) United States Patent
Fujiwara

(10) Patent No.: US 6,781,905 B2
(45) Date of Patent: Aug. 24, 2004

(54) SERIAL DATA DETECTION CIRCUIT PERFORMING SAME OFFSET ADJUSTMENT TO SIGNAL RECEIVER AS PERFORMED TO REFERENCE RECEIVER

(75) Inventor: Hideo Fujiwara, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/368,878

(22) Filed: Feb. 19, 2003

(65) Prior Publication Data

US 2003/0179016 A1 Sep. 25, 2003

(30) Foreign Application Priority Data

Feb. 22, 2002 (JP) ..................................... 2002-045933

(51) Int. Cl.$^7$ ................................................. G11C 7/02
(52) U.S. Cl. .............. 365/207; 365/189.07; 365/189.09
(58) Field of Search ............................ 365/207, 109.07, 365/189.09, 221, 205

(56) References Cited

U.S. PATENT DOCUMENTS 5,729,499 A    3/1998  Fujiwara et al.
5,737,273 A    4/1998  Fujiwara et al.
5,963,496 A  * 10/1999  Pathak et al. ................ 365/207

* cited by examiner

*Primary Examiner*—David Lam
(74) *Attorney, Agent, or Firm*—Cooper & Dunham LLP

(57) ABSTRACT

A pair of serial data signals having reciprocal signal levels are detected when a voltage of one of the serial data signals becomes larger than a voltage of the other serial data signal that is provided with an offset by a differential amplification circuit included in a signal detection circuit unit. A differential amplification circuit unit provides an offset for one of different predetermined constant voltages supplied thereto, and outputs signals by performing a differential amplification to the different constant voltages. An offset control circuit unit controls the offset provided by the differential amplification circuit unit so that voltages of the signals output by the differential amplification circuit unit coincide, and correspondingly controls the offset provided by the differential amplification circuit included in the signal detection circuit unit.

18 Claims, 12 Drawing Sheets

SERIAL DATA DETECTION CIRCUIT PERFORMING SAME OFFSET ADJUSTMENT TO SIGNAL RECEIVER AS PERFORMED TO REFERENCE RECEIVER

BACKGROUND OF THE INVENTION

1. Field of the Invention

The present invention generally relates to a serial data detection circuit and a received data signal processing device, and more particularly, to a serial data detection circuit and a received data signal processing device using the serial data detection circuit which are used in a high-speed serial communication system using a USB and so forth.

2. Description of the Related Art

Recently, products have been provided with a high-speed interface, and systems using high-speed serial communications have been developed. Such high-speed serial communications include a high-speed serial communication using a USB, for example. USB standards include USB 1.1; however, systems using USB 2.0 achieving a communication speed of 480 Mbps faster than USB 1.1 have been developed. Upon receiving data by these systems, an amplitude level of a signal is used in judging whether or not a transmission medium is connected, and whether or not received data exists. When the level exceeds a predetermined threshold value, a predetermined signal reproduction processing is applied to the received data. When the level does not exceed the predetermined threshold value, the predetermined signal reproduction processing is not applied to the received data.

FIG. 1 is a block diagram of a conventional example of a received data signal processing device 100 conforming to the foregoing USB 2.0 standard.

As shown in FIG. 1, the received data signal processing device 100 comprises a normal receiver 101, a digital signal processing circuit 102, and a signal lines DP and DM.

Further, the received data signal processing device 100 comprises an integration circuit 104 and a Schmitt circuit 105. The integration circuit 104 integrates an output signal (OUTb) of the signal detection receiver 103, and outputs the integrated signal. The Schmitt circuit 105 applies a waveform shaping to the output signal of the integration circuit 104, generates a receiver enable signal RE used for performing an enabling control of the normal receiver 101, and outputs the receiver enable signal RE to the normal receiver 101. The signal detection receiver 103, the integration circuit 104 and the Schmitt circuit 105 together form a serial data detection circuit 106 that detects whether or not serial data signals are supplied from the serial transmission lines DP and DM, and performs a driving control of the normal receiver 101 according to a result of the detection.

In a system using a USB and so forth, nodes of the serial transmission lines DP and DM become low-level in an idle state. In this state, the output of the normal receiver 101 becomes unstable so that problems occur in the signal processing performed by the digital signal processing circuit 102. For the purpose of avoiding such problems, the signal detection receiver 103 is provided so as to control the normal receiver 101 to operate only during a duration in which the signal detection receiver 103 detects serial data signals. Therefor, a threshold value is provided with an offset in the signal detection receiver 103.

FIG. 2 is a timing chart exemplifying the signals shown in FIG. 1. As mentioned above, the signal detection receiver 103 includes a threshold value provided with an offset. When the signal detection receiver 103 detects a reception of serial data signals from the serial transmission lines DP and DM, the signal detection receiver 103 generates a pulse signal corresponding to the serial data signals, and outputs the pulse signal as the output signal OUTb. The output signal OUTb is integrated by the integration circuit 104, and thereafter, is subjected to a waveform shaping by the Schmitt circuit 105 so as to be converted into a binary signal. The binary signal is output as the receiver enable signal RE to the normal receiver 101.

In other words, when the serial data detection circuit 106 detects a reception of serial data signals from the serial transmission lines DP and DM, the serial data detection circuit 106 raises the receiver enable signal RE to high level so as to cause the normal receiver 101 to operate. On the other hand, when the serial data detection circuit 106 does not detect a reception of serial data signals, the serial data detection circuit 106 makes the receiver enable signal RE low-level so as to cause the normal receiver 101 to stop operating.

FIG. 3 is a circuit diagram of an example of the signal detection receiver 103 shown in FIG. 1. In FIG. 3, the signal detection receiver 103 has a circuit configuration basically the same as a normal-type receiver except that input transistors 111 and 112 which are P-channel MOS transistors (hereinafter referred to as PMOS transistors) have different sizes so as to provide an offset. Besides, a constant bias voltage is applied to a gate of a PMOS transistor 113.

FIG. 4 is a circuit diagram of another example of the signal detection receiver 103 shown in FIG. 1.

In FIG. 4, the signal detection receiver 103 includes input transistors 121 and 122 which are PMOS transistors have identical sizes forming a differential pair. A constant current ia derived from a constant current source 130 is applied by PMOS transistors 131 to 133 to a node between the input transistor 121 and an N-channel MOS transistor (hereinafter referred to as NMOS transistor) so as to provide a threshold value with an offset.

However, with configurations such as shown in FIG. 3 and FIG. 4, there is a problem that characteristics of the transistors provided in the signal detection receiver 103 vary according to changes in processes, temperature and so forth, thereby varying the offset. In order to reduce the variation of the offset, it is conceivable that a gate area of each of the input transistors be increased. However, this not only causes a problem that an operating speed of the signal detection receiver 103 is decreased, but also involves a limit in reducing the variation of the offset.

SUMMARY OF THE INVENTION

It is a general object of the present invention to provide an improved and useful serial data detection circuit and a received data signal processing device in which the above-mentioned problems are eliminated.

A more specific object of the present invention is to provide a serial data detection circuit conforming to USB standards and so forth which can reduce variation of an offset and enable a high-speed operation by adjusting an amount of an offset current according to processes, temperature and so forth, and a received data signal processing device using the serial data detection circuit.

In order to achieve the above-mentioned objects, there is provided according to one aspect of the present invention a serial data detection circuit detecting whether or not a pair of serial data signals having reciprocal signal levels are supplied, the circuit composed of a signal detection circuit unit including a differential amplification circuit providing an offset for one serial data signal of the serial data signals, and outputting a predetermined signal indicating a detection of the serial data signals when a voltage of the other serial data signal of the serial data signals becomes larger than a voltage of the one serial data signal provided with the offset, a differential amplification circuit unit providing an offset for one constant voltage of different predetermined constant voltages supplied thereto, and outputting signals by performing a differential amplification to the constant voltages, and an offset control circuit unit controlling the offset provided by the differential amplification circuit unit so that voltages of the signals output by the differential amplification circuit unit coincide, and correspondingly controlling the offset provided by the differential amplification circuit included in the signal detection circuit unit.

According to the present invention, the offset used in the signal detection circuit unit is determined according to a feedback signal used by the offset control circuit unit with respect to the differential amplification circuit unit. Accordingly, even when processes, temperature and so forth are changed, variation of the offset can be reduced; thus, a stable system conforming to USB standards and so forth can be provided. Additionally, the signal indicating the detection of the serial data signals can be generated at high speed upon receiving serial data.

Additionally, in the serial data detection circuit, the signal detection circuit unit includes a flip-flop retaining an output signal output by a receiver of the serial data detection circuit, and outputting the output signal as a signal indicating whether or not the serial data signals are detected.

According to the present invention, the serial data signals can be detected accurately and in a shortened time.

In order to achieve the above-mentioned objects, there is also provided according to another aspect of the present invention a received data signal processing device provided in a high-speed serial communication system using a USB and so forth, the device including the above-mentioned serial data detection circuit.

According to the present invention, the offset used in the signal detection circuit unit is determined according to a feedback signal used by the offset control circuit unit with respect to the differential amplification circuit unit. Accordingly, even when processes, temperature and so forth are changed, variation of the offset can be reduced; thus, the high-speed serial communication system can be made stable conforming to USB standards and so forth. Additionally, the signal indicating the detection of the serial data signals can be generated at high speed upon receiving serial data; accordingly, the reception of the serial data signals can be detected accurately, and an accurate signal processing can be performed to the received signals.

Other objects, features and advantages of the present invention will become more apparent from the following detailed description when read in conjunction with the accompanying drawings.

DESCRIPTION OF THE PREFERRED EMBODIMENTS

A description will now be given, with reference to the drawings, of embodiments according to the present invention.

<Embodiment 1>

Figure 1:
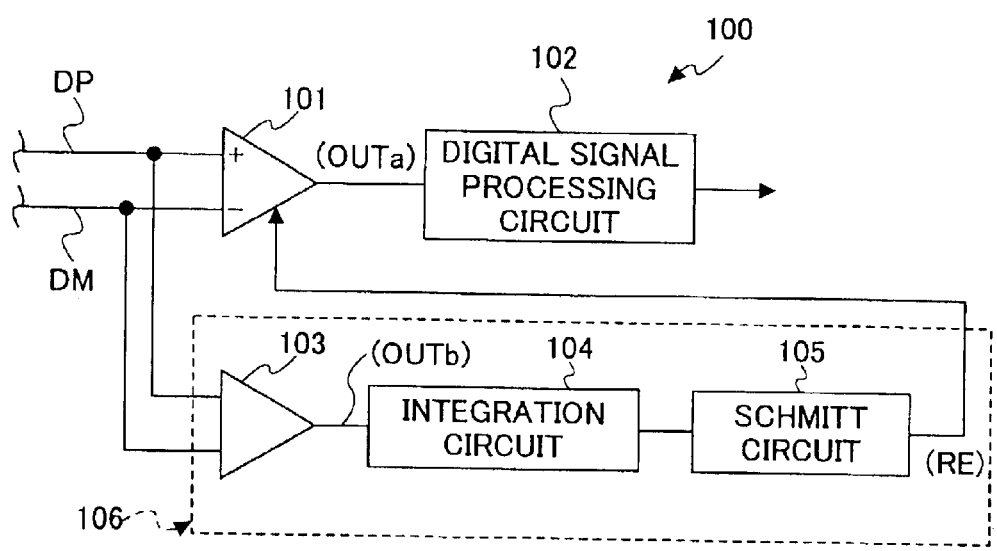
FIG. 1 is a block diagram of an example of a conventional received data signal processing device.
Figure 2:
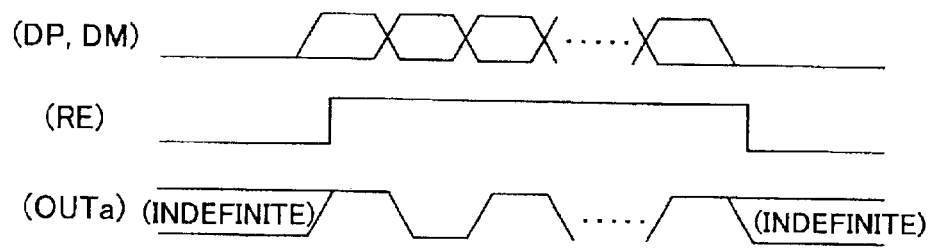
FIG. 2 is a timing chart exemplifying signals shown in FIG. 1.
Figure 3:
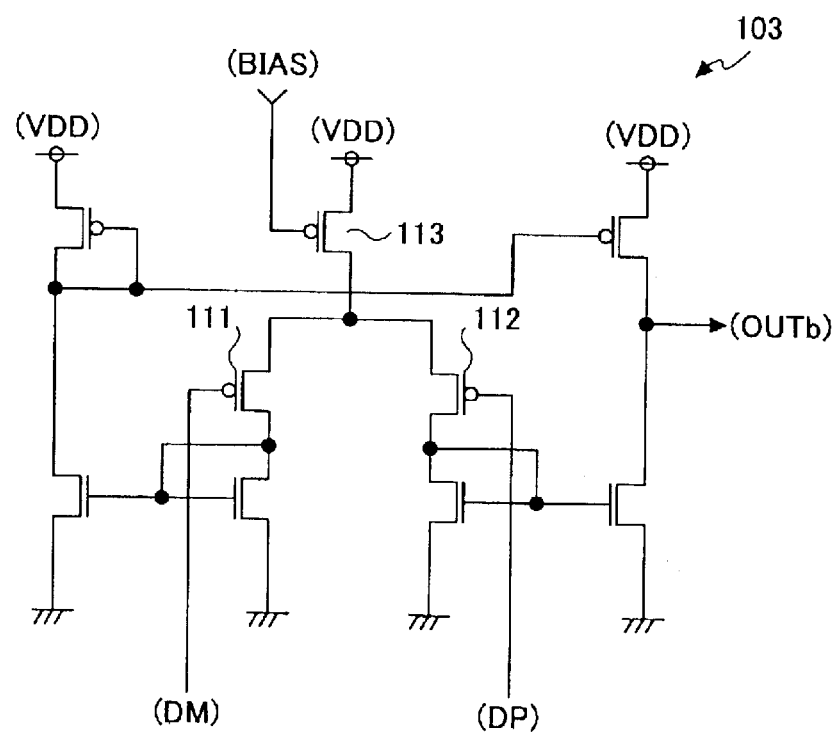
FIG. 3 is a circuit diagram of an example of a signal detection receiver shown in FIG. 1.
Figure 4:
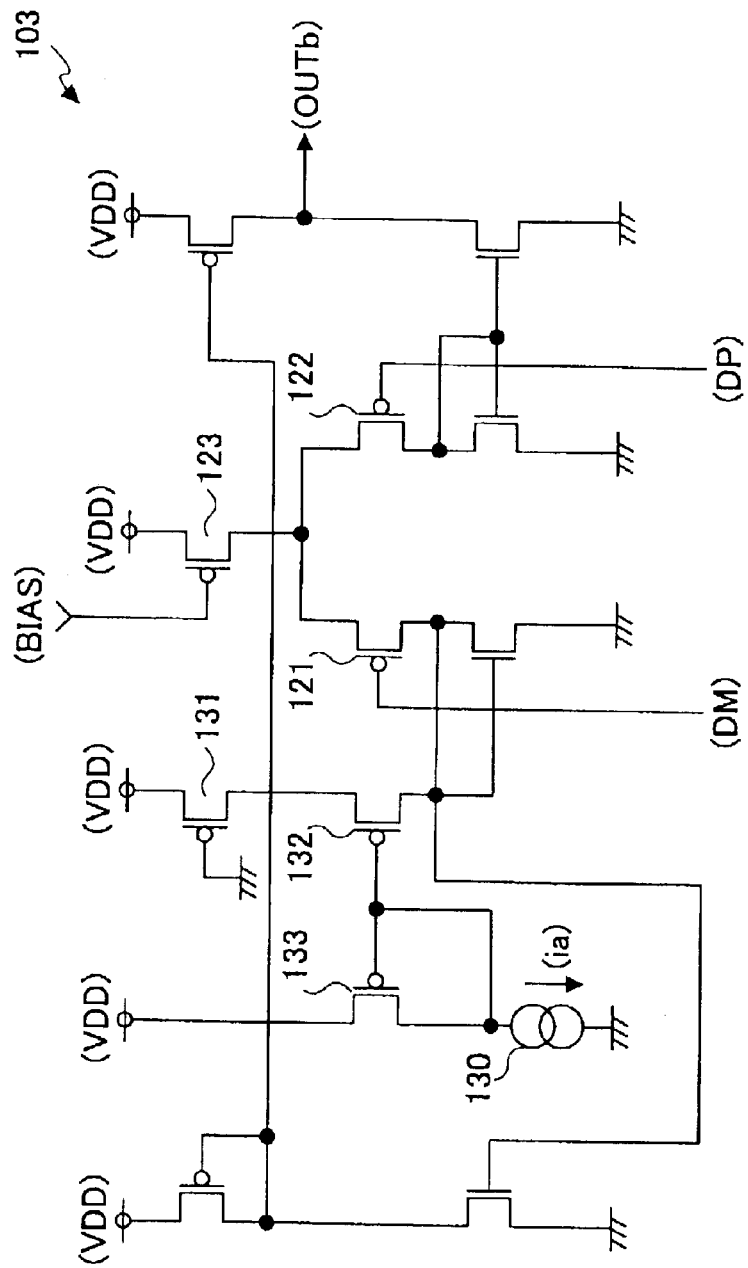
FIG. 4 is a circuit diagram of another example of the signal detection receiver shown in FIG. 1.
Figure 5:
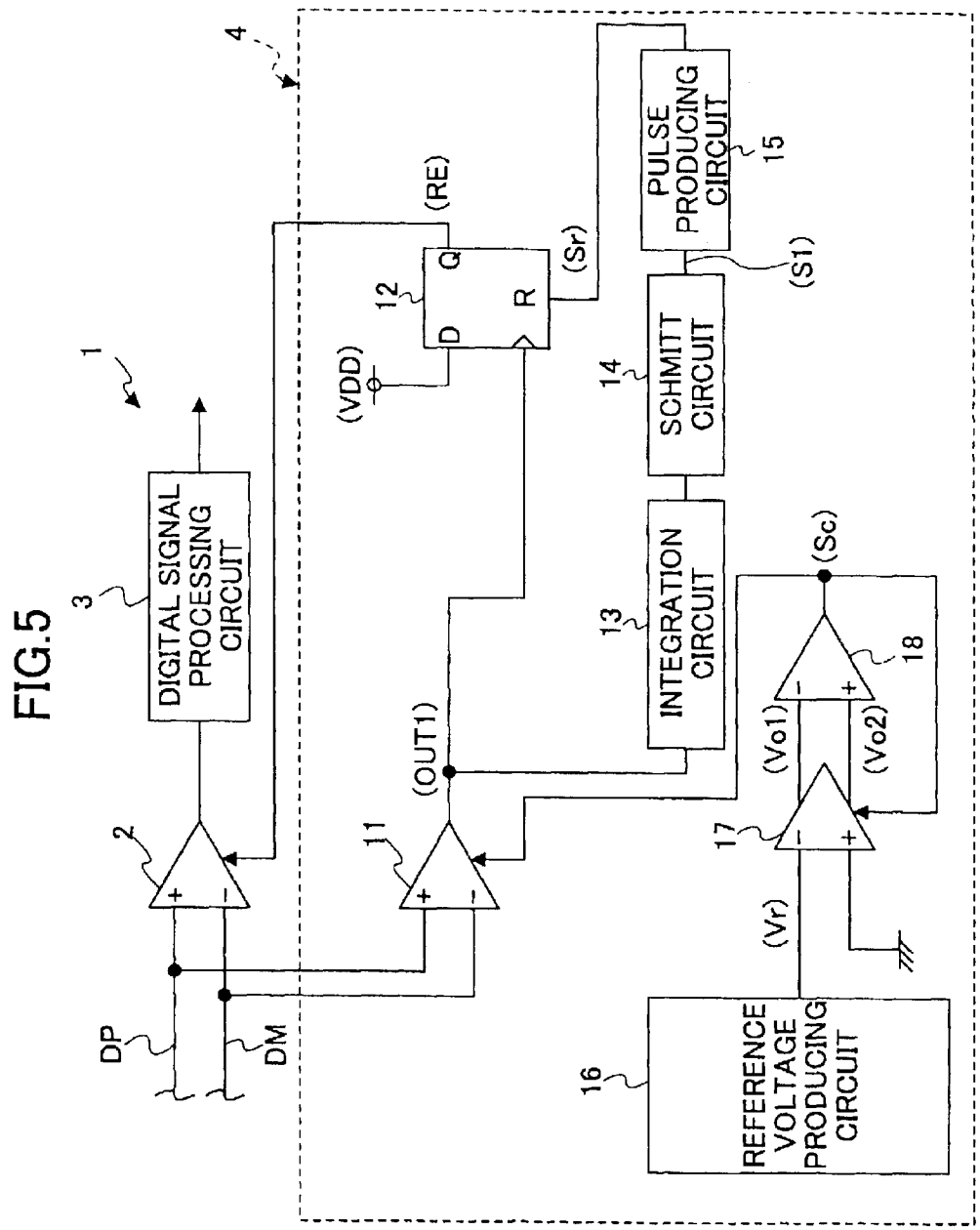
FIG. 5 is a circuit diagram of an example of a serial data detection circuit according to a first embodiment of the present invention.

FIG. 5 is a circuit diagram of an example including a serial data detection circuit 4 according to a first embodiment of the present invention. In the example shown in FIG. 5, the serial data detection circuit 4 is used in a received data signal processing device 1 conforming to USB 2.0.

As shown in FIG. 5, the received data signal processing device 1 comprises a normal receiver 2, a digital signal processing circuit 3, and the serial data detection circuit 4. The normal receiver 2 performs a normal signal processing of internally converting a pair of serial data signals having reciprocal signal levels transmitted from serial transmission lines DP and DM into a digital signal. The digital signal processing circuit 3 applies a predetermined process to a signal output from the normal receiver 2, and outputs the processed signal. The serial data detection circuit 4 detects whether or not serial data signals are supplied from the serial transmission lines DP and DM.

When the serial data detection circuit 4 detects that serial data signals are supplied from the serial transmission lines DP and DM, the serial data detection circuit 4 raises a receiver enable signal RE to high level so as to cause the normal receiver 2 to operate. On the other hand, when the serial data detection circuit 4 does not detect that serial data signals are supplied, the serial data detection circuit 4 makes the receiver enable signal RE low-level so as to cause the normal receiver 2 to stop operating.

The serial data detection circuit 4 comprises a receiver 11 and a D flip-flop 12. The receiver 11 is composed of a differential amplification circuit connected to the serial transmission lines DP and DM at noninverting and inverting input terminals, respectively, so as to be supplied with a pair of serial data signals. An output signal OUT1 of the receiver 11 is supplied to a clock signal input terminal of the D flip-flop 12. The receiver 11 includes a predetermined offset for a threshold value. The receiver enable signal RE used for performing an operational control of the normal receiver 2 is output from an output terminal Q of the D flip-flop 12. A power source voltage VDD is applied to a D input terminal of the D flip-flop 12.

Additionally, the serial data detection circuit 4 comprises an integration circuit 13, a Schmitt circuit 14 and a pulse producing circuit 15. The integration circuit 13 integrates the output signal OUT1 of the receiver 11. The Schmitt circuit 14 performs a waveform shaping of a signal output from the integration circuit 13, and outputs the waveform-shaped signal (S1). The pulse producing circuit 15 generates a pulse (Sr: a reset signal) according to the signal supplied from the Schmitt circuit 14, and outputs the pulse (Sr) to a reset signal input terminal R of the D flip-flop 12.

Further, the serial data detection circuit 4 comprises a reference voltage producing circuit 16, a reference receiver 17 and an operational amplifier 18. The reference voltage producing circuit 16 generates and outputs a predetermined reference voltage Vr. The reference receiver 17 forms a differential amplifier providing an offset to a signal supplied to an inverting input terminal thereof. The operational amplifier 18 compares output voltages Vo1 and Vo2 supplied from the reference receiver 17 with each other, and outputs a voltage corresponding to a result of the comparison to the receiver 11 and the reference receiver 17. Besides, the normal receiver 2 forms a receiver circuit; the receiver 11, the D flip-flop 12, the integration circuit 13, the Schmitt circuit 14 and the pulse producing circuit 15 form a signal detection circuit unit; the integration circuit 13, the Schmitt circuit 14 and the pulse producing circuit 15 also form a reset circuit; the pulse producing circuit 15 also forms a reset signal producing circuit; the reference voltage producing circuit 16 and the reference receiver 17 form a differential amplification circuit unit; and the operational amplifier 18 forms an offset control circuit unit.

In the receiver 11, the noninverting input terminal and the inverting input terminal are connected with the serial transmission lines DP and DM, respectively, and an output terminal is connected to the D flip-flop 12 and the integration circuit 13.

In the reference receiver 17, the reference voltage Vr is supplied to the inverting input terminal, and a ground voltage is supplied to a noninverting input terminal. The output voltage Vo1 of the reference receiver 17 is supplied to an inverting input terminal of the operational amplifier 18, and the output voltage Vo2 of the reference receiver 17 is supplied to a noninverting input terminal of the operational amplifier 18. An output signal of the operational amplifier 18 is output to each of the receiver 11 and the reference receiver 17 as a control signal Sc for controlling the offset.

Figure 6:
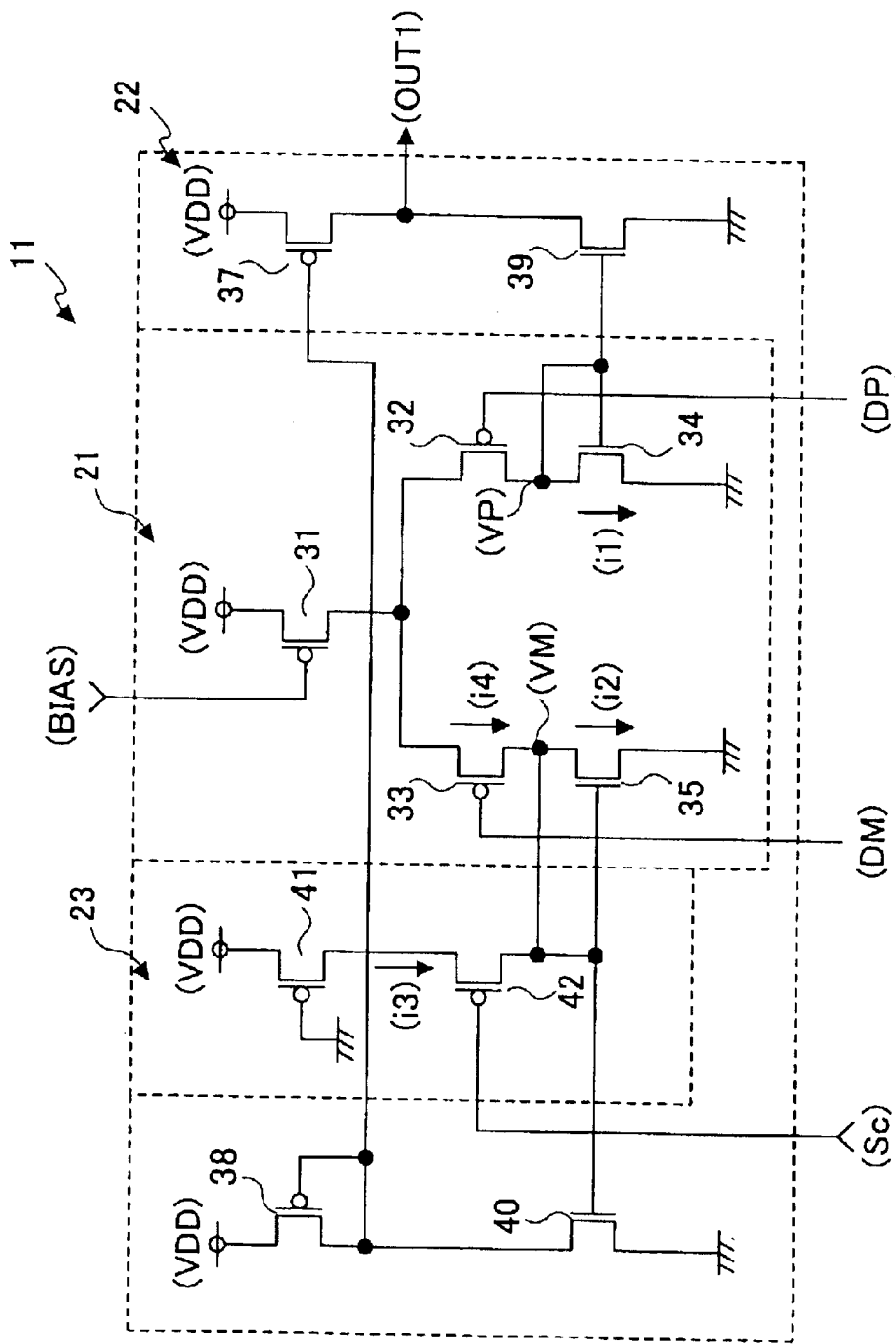
FIG. 6 is a circuit diagram of an example of an internal circuit of a receiver shown in FIG. 5.

FIG. 6 is a circuit diagram of an example of an internal circuit of the receiver 11.

In FIG. 6, the receiver 11 comprises a differential amplification circuit unit 21, an output circuit unit 22 and an offset circuit unit 23.

The differential amplification circuit unit 21 comprises PMOS transistors 31 to 33 and NMOS transistors 34 and 35. The PMOS transistors 31 and 32 and the NMOS transistor 34 are connected in series between the power source voltage VDD and the ground voltage.

Additionally, a series circuit composed of the PMOS transistor 33 and the NMOS transistor 35 is connected in parallel with a series circuit composed of the PMOS transistor 32 and the NMOS transistor 34. Each of the NMOS transistors 34 and 35 forms a diode by a gate and a drain being connected to each other. A gate of the PMOS transistor 31 is biased by a predetermined constant voltage being applied thereto so that the PMOS transistor 31 forms a constant current source. A gate of the PMOS transistor 32 forms the noninverting input terminal, and is connected with the serial transmission line DP, and a gate of the PMOS transistor 33 forms the inverting input terminal, and is connected with the serial transmission line DM.

The output circuit unit 22 comprises PMOS transistors 37 and 38 and NMOS transistors 39 and 40. The PMOS transistors 37 and 38 together form a current mirror circuit. Additionally, the NMOS transistor 39 and the NMOS transistor 34 together form a current mirror circuit, and the NMOS transistor 40 and the NMOS transistor 35 together form a current mirror circuit. A series circuit composed of the PMOS transistor 37 and the NMOS transistor 39 and a series circuit composed of the PMOS transistor 38 and the NMOS transistor 40 are connected in parallel with each other between the power source voltage VDD and the ground voltage. A node between the PMOS transistor 37 and the NMOS transistor 39 forms the output terminal of the receiver 11, and the output signal OUT1 is output from the output terminal.

Gates of the PMOS transistors 37 and 38 are connected to each other, and are connected to a drain of the PMOS transistor 38. A gate of the NMOS transistor 39 is connected to the gate of the NMOS transistor 34 at a node, and the node is connected to the drain of the NMOS transistor 34. Similarly, a gate of the NMOS transistor 40 is connected to the gate of the NMOS transistor 35 at a node, and the node is connected to the drain of the NMOS transistor 35.

The offset circuit unit 23 comprises PMOS transistors 41 and 42. A series circuit composed of the PMOS transistors 41 and 42 is connected between the power source voltage VDD and the drain of the NMOS transistor 35. A gate of the PMOS transistor 41 is connected to the ground voltage. A gate of the PMOS transistor 42 is supplied with the control signal Sc from the operational amplifier 18.

In FIG. 6 showing the configuration of the receiver 11, a drain current of the NMOS transistor 34 is represented by i1, and a drain current of the NMOS transistor 35 is represented by i2. Further, a current flowing from the offset circuit unit 23 to the drain of the NMOS transistor 35 is represented by i3, and a drain current of the PMOS transistor 33 is represented by i4. The current i2 is a sum of the current i3 and the current i4. The current i3 is used for providing an offset for the threshold value of the receiver 11.

The current i1 is determined by a value of voltage applied from the serial transmission line DP, and the current i4 is determined by a value of voltage applied from the serial transmission line DM. The offset for the threshold value of the receiver 11 becomes larger in proportion to a value of the current i3, and can be adjusted according to a voltage of the control signal Sc supplied from the operational amplifier 18. Specifically, as the voltage applied from the operational amplifier 18 becomes smaller, the current i3 becomes larger so that the offset becomes larger; on the other hand, as the voltage applied from the operational amplifier 18 becomes larger, the current i3 becomes smaller so that the offset becomes smaller. Thus, the offset of the receiver 11 can be adjusted according to the output signal Sc of the operational amplifier 18.

Figure 7:
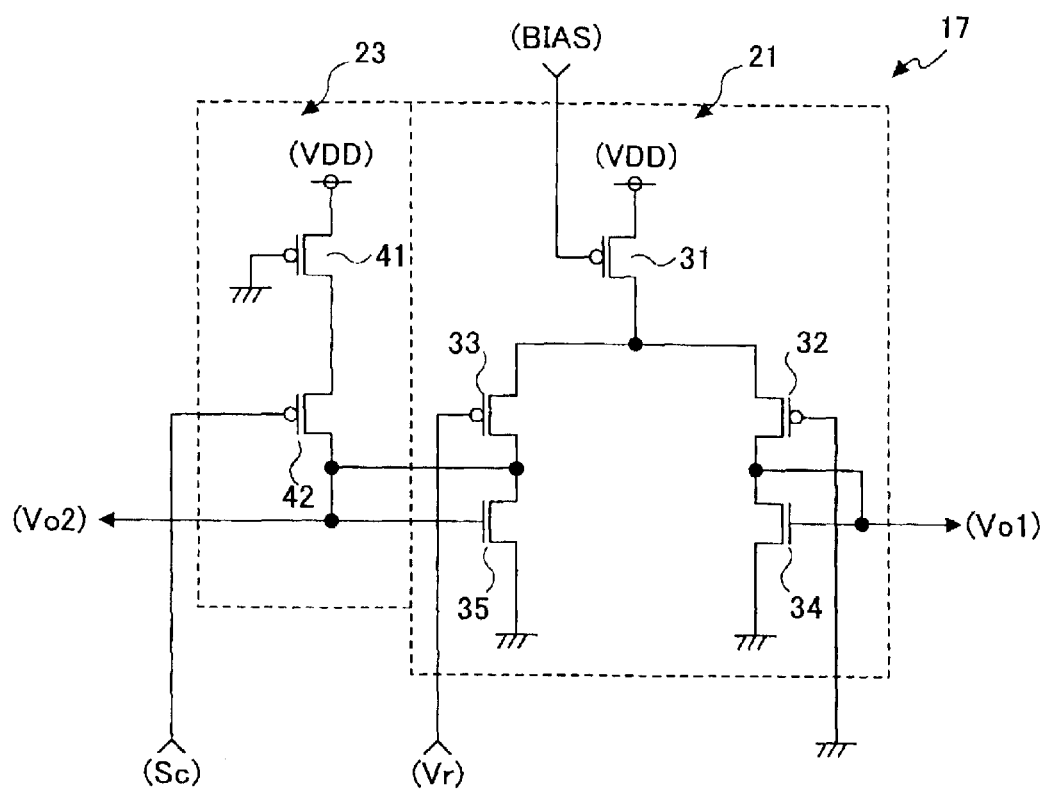
FIG. 7 is a circuit diagram of an example of an internal circuit of a reference receiver shown in FIG. 5.

FIG. 7 is a circuit diagram of an example of an internal circuit of the reference receiver 17. Elements in FIG. 7 that are identical or equivalent to the elements shown in FIG. 6 are referenced by the same reference marks, and will not be described in detail.

In FIG. 7, the reference receiver 17 comprises the differential amplification circuit unit 21 and the offset circuit unit 23. In the differential amplification circuit unit 21, the ground voltage is supplied to the gate of the PMOS transistor 32, and the reference voltage Vr is supplied to the gate of the PMOS transistor 33. The output voltage Vo1 is output from a node between the PMOS transistor 32 and the NMOS transistor 34, and the output voltage Vo2 is output from a node between the PMOS transistor 33 and the NMOS transistor 35.

Accordingly, the differential outputs (the output voltages Vo1 and Vo2) output from the reference receiver 17 are supplied to the respective input terminals of the operational amplifier 18, and the voltage representing the result of the comparison therebetween is fed back to the reference receiver 17 so as to adjust the offset. The operational amplifier 18 adjusts the offset of the reference receiver 17 so that the output voltages Vo1 and Vo2 of the reference receiver 17 coincide. Therefore, each of the receiver 11 and the reference receiver 17 is provided with a threshold value according to the reference voltage Vr. Thus, the threshold value of each of the receiver 11 and the reference receiver 17 becomes constant even when changes occur in processes, temperature, power source voltage and so forth.

Besides, amplitude of serial data signals prescribed by USB 2.0 is 400 mV, which is considerably smaller than 3.3 V prescribed by USB 1.1. When the amplitude of serial data signals becomes smaller, it becomes difficult to detect a reception of serial data signals. Even in this case, the serial data detection circuit 4 shown in FIG. 5 to FIG. 7 can accurately detect a reception of serial data signals from the serial transmission lines DP and DM. In addition, the serial data detection circuit 4 does not need to increase a gate area of each of input transistors (e.g., the PMOS transistors 31 and 32) for the purpose of reducing variation of the offset as conventionally; thus, the serial data detection circuit 4 can operate at high speed.

Figure 8:
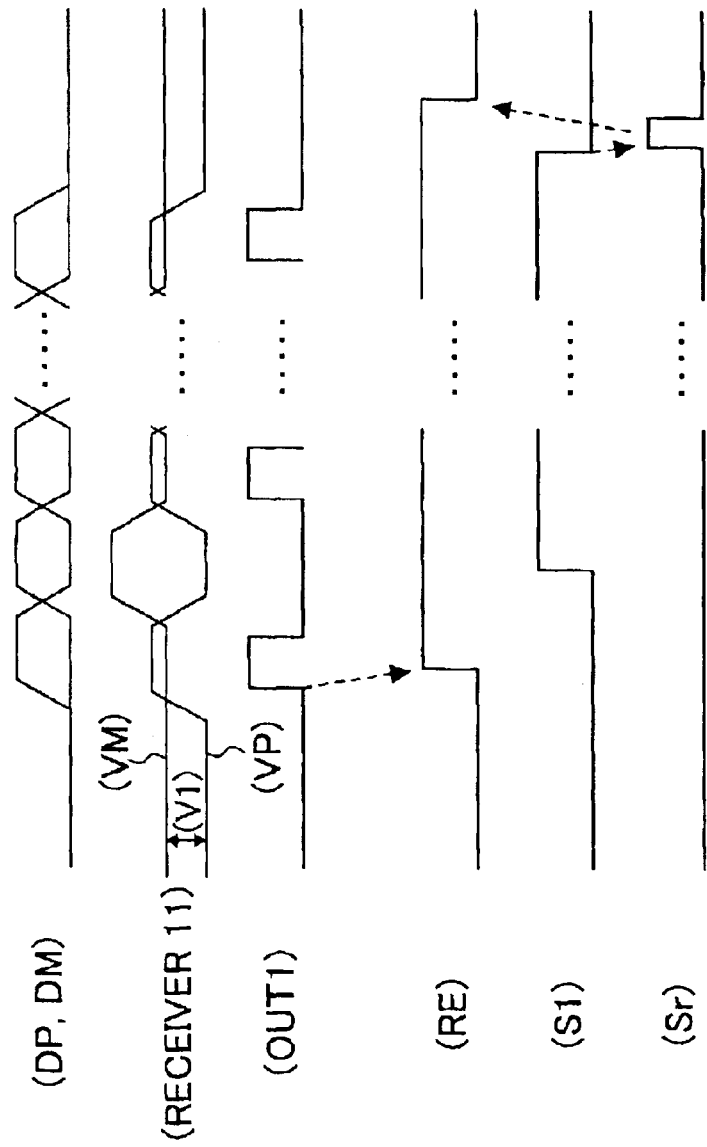
FIG. 8 is a timing chart exemplifying waveforms of signals received and generated by the serial data detection circuit shown in FIG. 5 to FIG. 7.

FIG. 8 is a timing chart exemplifying waveforms of the signals received and generated by the serial data detection circuit 4 shown in FIG. 5 to FIG. 7. A description will be given, with reference to FIG. 8, of an example of an operation of generating the receiver enable signal RE in the serial data detection circuit 4. In FIG. 8, VP represents a voltage at a node between the PMOS transistor 32 and the NMOS transistor 34 shown in FIG. 6, and VM represents a voltage at a node between the PMOS transistor 33 and the NMOS transistor 35 shown in FIG. 6. Additionally, V1 represents an offset voltage of differential outputs of the receiver 11, and the offset voltage V1 is proportional to the reference voltage Vr.

The output signal OUT1 of the receiver 11 is supplied as a clock signal to the D flip-flop 12, and the power source voltage VDD is applied to the D input terminal of the D flip-flop 12; accordingly, when the clock signal rises, the D flip-flop 12 outputs the receiver enable signal RE at high level from the output terminal Q thereof so as to cause the normal receiver 2 to operate. The output signal OUT1 of the receiver 11 is supplied also to the integration circuit 13, is integrated by the integration circuit 13, and is supplied to the Schmitt circuit 14.

The Schmitt circuit 14 outputs the signal S1 that is obtained by waveform-shaping the supplied signal into a binary signal to the pulse producing circuit 15. During a duration in which serial data signals are supplied from the serial transmission lines DP and DM, a pulse signal is output from the receiver 11 as the output signal OUT1. During this duration, a low-level signal is output from an output terminal of the pulse producing circuit 15. When serial data signals are not supplied from the serial transmission lines DP and DM, the output signal OUT1 of the receiver 11 becomes low-level, and the pulse signal Sr at high level is output from the output terminal of the pulse producing circuit 15.

When the supplied signal S1 falls from high level to low level, the pulse producing circuit 15 supplies a predetermined one-shot pulse to the reset signal input terminal R of the D flip-flop 12 as the signal Sr. When the high-level pulse is supplied to the reset signal input terminal R, the D flip-flop 12 causes the receiver enable signal RE from the output terminal Q to fall from high level to low level at the same time as when the supplied pulse falls, thereby causing the normal receiver 2 to stop operating.

As described above, the serial data detection circuit 4 according to the present first embodiment uses the operational amplifier 18 to cause the offset circuit unit 23 to perform an offset adjustment with respect to the differential amplification circuit unit 21 of the reference receiver 17 so that the pair of the output voltages Vo1 and Vo2 of the reference receiver 17 supplied with different predetermined constant voltages coincide; also the serial data detection circuit 4 uses the operational amplifier 18 to cause the same offset adjustment as performed with respect to the reference receiver 17 to be performed with respect to the receiver 11 so that the offset of the receiver 11 becomes constant. Thus, according to the present first embodiment, variation of an offset in a receiver used for serial data detection prescribed by USB standards and so forth can be reduced, and serial data signals having small amplitude as prescribed by USB 2.0 can be detect accurately and at high speed.

<Embodiment 2>

USB standards prohibit a state in which a pair of serial data signals from serial transmission lines continue to be high-level or low-level in a period equal to or longer than a predetermined bit length. However, in the foregoing first embodiment, when such state occurs, serial data signals are judged not to be detected so as to cause the normal receiver 2 to stop operating; thus, the occurrence of such abnormal state cannot be detected. Thereupon, in the present second embodiment, the normal receiver 2 is not caused to stop operating even when the above-mentioned state occurs.

Figure 9:
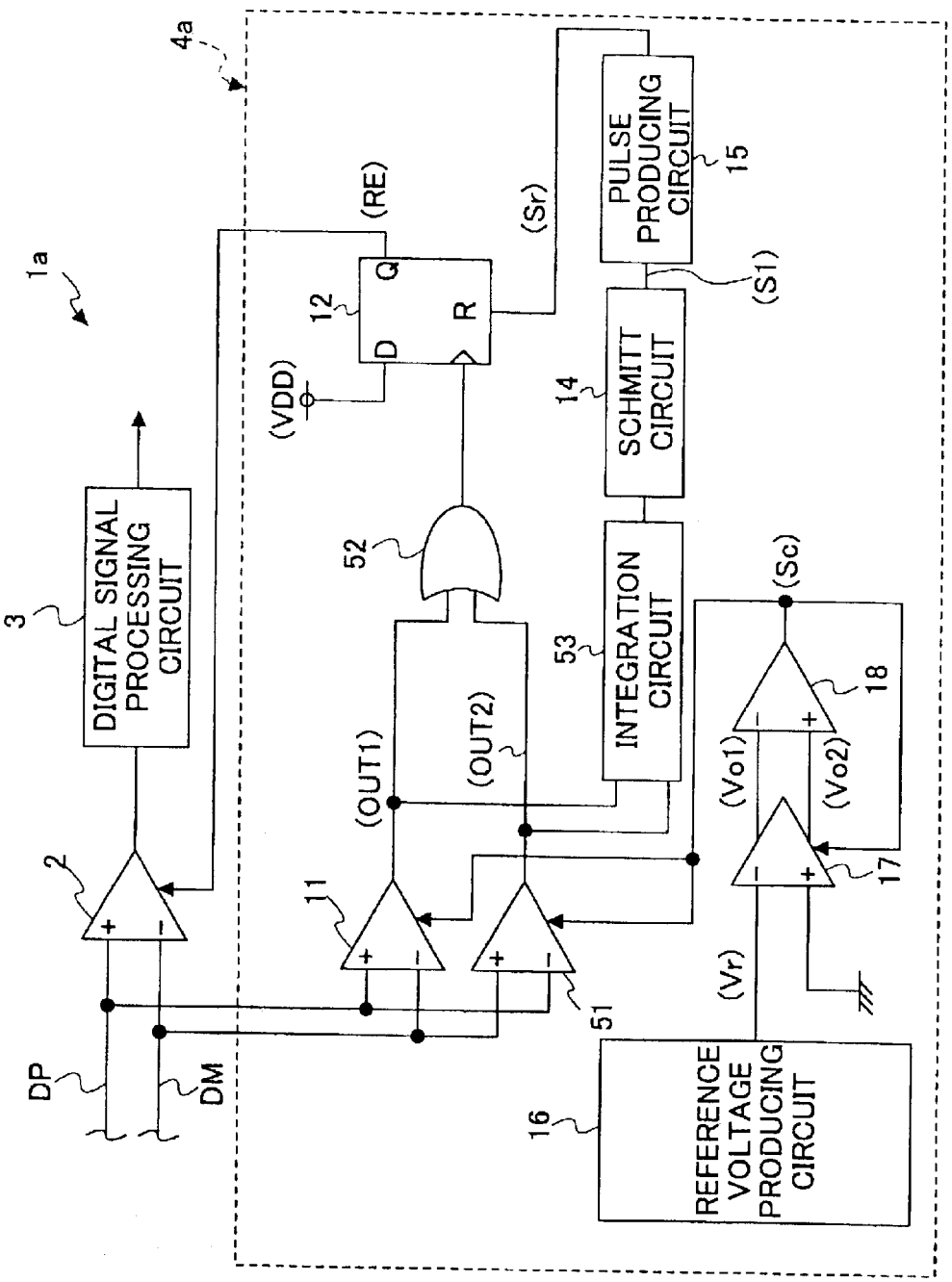
FIG. 9 is a circuit diagram of an example of a serial data detection circuit according to a second embodiment of the present invention.

FIG. 9 is a circuit diagram of an example including a serial data detection circuit 4a according to the second embodiment of the present invention. Elements in FIG. 9 that are identical or equivalent to the elements shown in FIG. 5 are referenced by the same reference marks, and will not be described in detail, and different points therebetween will be mainly described. Also in the example shown in FIG. 9, the serial data detection circuit 4a is used in a received data signal processing device 1a conforming to USB 2.0.

In the present second embodiment, the serial data detection circuit 4a is basically similar to the serial data detection circuit 4 shown in FIG. 5, and the received data signal processing device 1a is basically similar to the received data signal processing device 1 shown in FIG. 5 except that a receiver 51 and an OR circuit 52 are added in the serial data detection circuit 4a, and that the integration circuit 13 is modified to an integration circuit 53 having a different circuit configuration therefrom.

As shown in FIG. 9, the received data signal processing device 1a comprises the normal receiver 2, the digital signal processing circuit 3, and the serial data detection circuit 4a that detects whether or not serial data signals are supplied from the serial transmission lines DP and DM.

When the serial data detection circuit 4a detects that serial data signals are supplied from the serial transmission lines DP and DM, the serial data detection circuit 4a raises the receiver enable signal RE to high level so as to cause the normal receiver 2 to operate. On the other hand, when the serial data detection circuit 4a does not detect that serial data signals are supplied, the serial data detection circuit 4a makes the receiver enable signal RE low-level so as to cause the normal receiver 2 to stop operating.

The serial data detection circuit 4a comprises the receiver 11, the receiver 51, the OR circuit 52 and the D flip-flop 12. The receiver 51 is composed of a differential amplification circuit connected to the serial transmission lines DP and DM at inverting and noninverting input terminals, respectively, so as to be supplied with a pair of serial data signals. The OR circuit 52 performs an OR operation with respect to output signals OUT1 and OUT2 of the respective receivers 11 and 51. An output signal of the OR circuit 52 is supplied to the clock signal input terminal of the D flip-flop 12.

In the present second embodiment, the receiver 11 forms a first receiver, and the receiver 51 forms a second receiver. The receiver 51 includes a predetermined offset for a threshold value, as does the receiver 11. Additionally, the serial data detection circuit 4a comprises the integration circuit 53, the Schmitt circuit 14, the pulse producing circuit 15, the reference voltage producing circuit 16, the reference receiver 17 and the operational amplifier 18. The integration circuit 53 synthesizes and integrates the output signals OUT1 and OUT2 of the receivers 11 and 51. The Schmitt circuit 14 performs a waveform shaping of a signal output from the integration circuit 53, and outputs the waveform-shaped signal (S1).

The output terminal of the receiver 11 is connected to one input terminal of the OR circuit 52 and the integration circuit 53. In the receiver 51, the noninverting input terminal and the inverting input terminal are connected with the serial transmission lines DM and DP, respectively, and an output terminal is connected to the other input terminal of the OR circuit 52 and the integration circuit 53.

The output signal of the operational amplifier 18 is output to each of the receiver 11, the receiver 51 and the reference receiver 17 as the control signal Sc for controlling the offset. Besides, an example of an internal circuit of the receiver 51 is the same as the example of the internal circuit of the receiver 11 shown in FIG. 6. However, in the receiver 51, the gate of the PMOS transistor 32 is connected with the serial transmission line DM, and the gate of the PMOS transistor 33 is connected with the serial transmission line DP.

Figure 10:
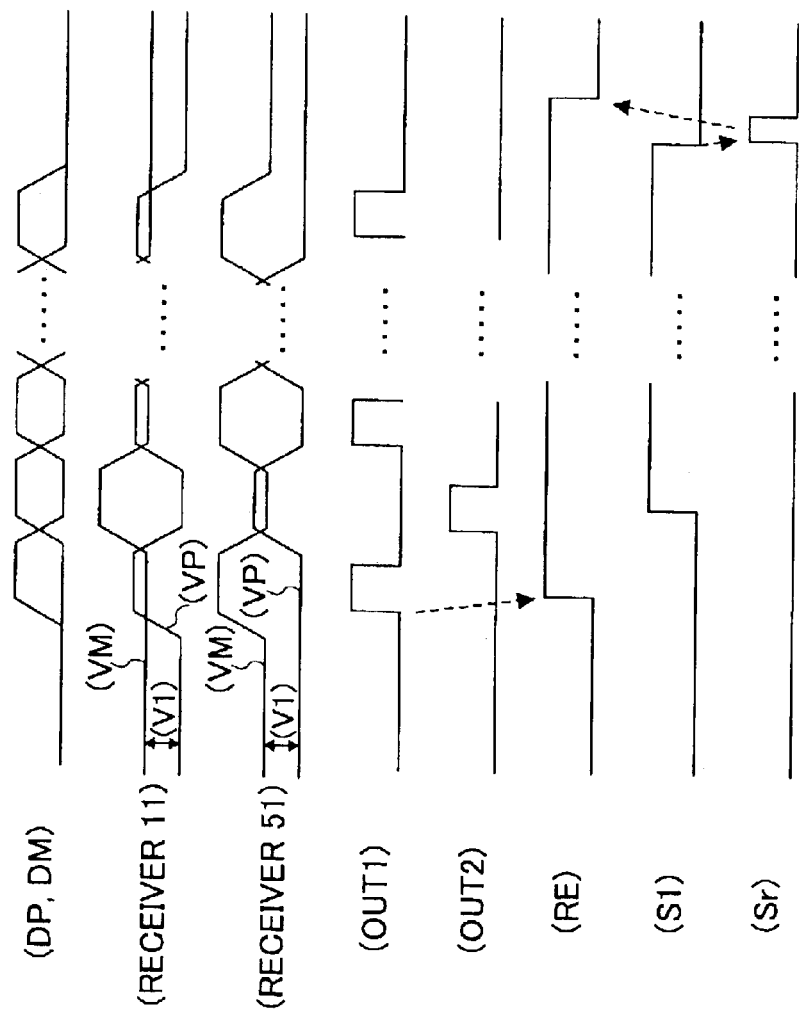
FIG. 10 is a timing chart exemplifying waveforms of signals received and generated by the serial data detection circuit shown in FIG. 9.

FIG. 10 is a timing chart exemplifying waveforms of the signals received and generated by the serial data detection circuit 4a shown in FIG. 9. A description will be given, with reference to FIG. 10, of an example of an operation of generating the receiver enable signal RE in the serial data detection circuit 4a. In FIG. 10, offset voltages of differential outputs of the receivers 11 and 51 are represented by V1.

The signal obtained by the OR circuit 52 performing the OR operation with respect to the output signals OUT1 and OUT2 of the receivers 11 and 51 is supplied as a clock signal to the D flip-flop 12. The output signals OUT1 and OUT2 of the receivers 11 and 51 are supplied also to the integration circuit 53, and are synthesized and integrated by the integration circuit 53 so as to be supplied to the Schmitt circuit 14.

Figure 11:
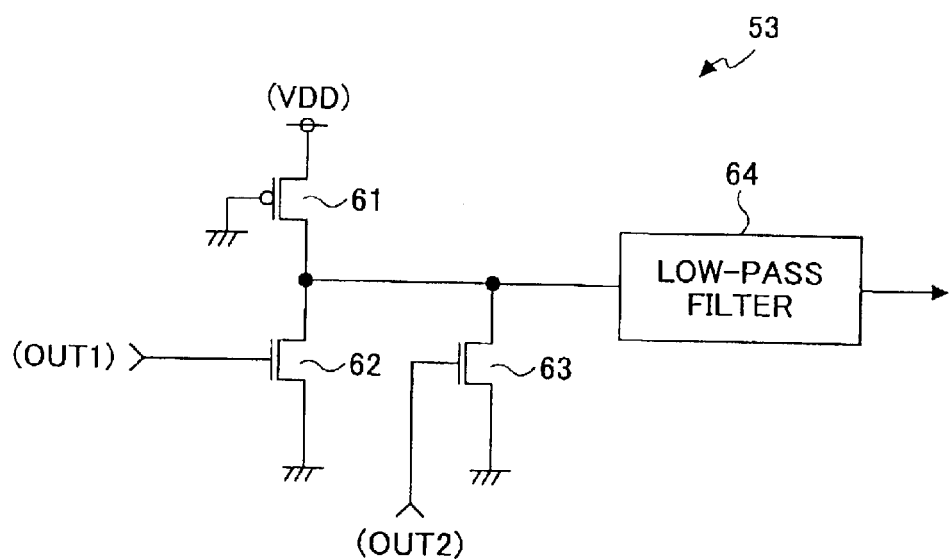
FIG. 11 is a circuit diagram of an example of an internal circuit of an integration circuit shown in FIG. 9.

FIG. 11 is a circuit diagram of an example of an internal circuit of the integration circuit 53 shown in FIG. 9.

In FIG. 11, the integration circuit 53 comprises a PMOS transistor 61, NMOS transistors 62 and 63, and a low-pass filter 64. The PMOS transistor 61 and the NMOS transistor 62 are connected in series between the power source voltage VDD and the ground voltage. Further, the NMOS transistor 63 is connected in parallel with the NMOS transistor 62, and a gate of the PMOS transistor 61 is connected to the ground voltage. A gate of the NMOS transistor 62 is supplied with the output signal OUT1 from the receivers 11, and a gate of the NMOS transistor 63 is supplied with the output signal OUT2 from the receivers 51. A node connecting the PMOS transistor 61 and the NMOS transistors 62 and 63 is connected to an input terminal of the low-pass filter 64.

In this configuration, a current drive capacity of each of the NMOS transistors 62 and 63 is arranged to be larger than a current drive capacity of the PMOS transistor 61, and an ON resistance of each of the NMOS transistors 62 and 63 is arranged to be sufficiently smaller than an ON resistance of the PMOS transistor 61. By these arrangements, the output signals OUT1 and OUT2 supplied to the respective gates of the NMOS transistors 62 and 63 are supplied to the low-pass filter 64 with signal levels thereof being inverted, and are integrated by the low-pass filter 64 so as to be supplied to the Schmitt circuit 14.

The Schmitt circuit 14 waveform-shapes the supplied signal into a binary signal, inverts a signal level thereof, and outputs the inverted signal S1 to the pulse producing circuit 15. Therefore, in the serial data detection circuit 4a shown in FIG. 9, the Schmitt circuit 14 forms an inverter circuit. Besides, the integration circuit 13 shown in FIG. 5 may have a configuration obtained by excepting the NMOS transistor 63 from the configuration shown in FIG. 11. In this case, the Schmitt circuit 14 shown in FIG. 5 may form an inverter circuit.

During a duration in which serial data signals are supplied from the serial transmission lines DP and DM, pulse signals are output from the receivers 11 and 51 as the output signals OUT1 and OUT2, respectively. During this duration, the signal Sr at low level is output from the output terminal of the pulse producing circuit 15. When serial data signals are not supplied from the serial transmission lines DP and DM, the output signals OUT1 and OUT2 of the receivers 11 and 51 become low-level, respectively, and the pulse signal Sr at high level is output from the output terminal of the pulse producing circuit 15.

Besides, for example, in a case where a low-level signal having a length equal to or longer than a prescribed length is supplied from the serial transmission line DP, a high-level signal having a length equal to the length of the low-level signal is supplied from the serial transmission line DM. During a period corresponding to this length, the signal OUT1 at low level is output from the output terminal of the receiver 11, whereas the signal OUT2 at high level is output from the output terminal of the receiver 51; accordingly, the output signal S1 of the Schmitt circuit 14 continues to be high-level so that the pulse signal Sr is not output from the pulse producing circuit 15; thus, the receiver enable signal RE at high level is output from the D flip-flop 12.

A case where a low-level signal having a length equal to or longer than a prescribed length is supplied from the serial transmission line DM is similar to the foregoing case where a low-level signal having a length equal to or longer than a prescribed length is supplied from the serial transmission line DP Thus, even when levels of signals supplied from the serial transmission lines DP and DM are not inverted for a duration equal to or longer than a prescribed duration, the serial data detection circuit 4a does not cause the normal receiver 2 to stop operating.

As described above, in the serial data detection circuit 4a according to the present second embodiment, the serial transmission line DP is connected to the noninverting input terminal of the receiver 11 and to the inverting input terminal of the receiver 51, and the serial transmission line DM is connected to the inverting input terminal of the receiver 11 and to the noninverting input terminal of the receiver 51. With this arrangement, the operational amplifier 18 is used to cause the offset circuit unit 23 to perform an offset adjustment with respect to the differential amplification circuit unit 21 of the reference receiver 17 so that the pair of the output voltages Vo1 and V2 of the reference receiver 17 supplied with different predetermined constant voltages coincide; also the operational amplifier 18 is used to cause the same offset adjustment the same offset adjustment as performed with respect to the reference receiver 17 to be performed with respect to the receivers 11 and 51 so that the offset of each of the receivers 11 and 51 becomes constant.

Thus, according to the present second embodiment, the same advantages can be achieved as in the foregoing first embodiment. In addition, even when an abnormal state occurs in which a pair of serial data signals from serial transmission lines continue to be high-level or low-level in a period equal to or longer than a predetermined bit length, a normal receiver can be caused to operate so as to supply subsequent circuits with data in the abnormal state, whereby the abnormal state can be treated by the subsequent circuits.

In the foregoing first and second embodiments, the examples of the serial data detection circuits, 4 and 4a each include one D flip-flop 12. However, at least one D flip-flop may be connected in series at a subsequent stage to the D flip-flop 12 so as to form a serial-in serial-out shift register. For example, when the shift register is formed by using three D flip-flops, an output terminal Q of the first D flip-flop is connected to a clock signal input terminal of the second D flip-flop, and an output terminal Q of the second D flip-flop is connected to a clock signal input terminal of the third D flip-flop.

A signal output from an output terminal Q of the third D flip-flop is supplied to the normal receiver 2 as the receiver enable signal RE. Besides, the power source voltage VDD is applied to the D input terminal of each of the three D flip-flops, and the signal Sr is supplied from the pulse producing circuit 15 to the reset signal input terminal R of each of the three D flip-flops. According to this variation, although a time required for detecting serial data signals becomes longer, the receiver enable signal RE becomes less likely to be output erroneously when a receiver reacts to noises and so forth. Besides, the number of D flip-flops may be determined according to a system using the received data signal processing device.

Figure 12:
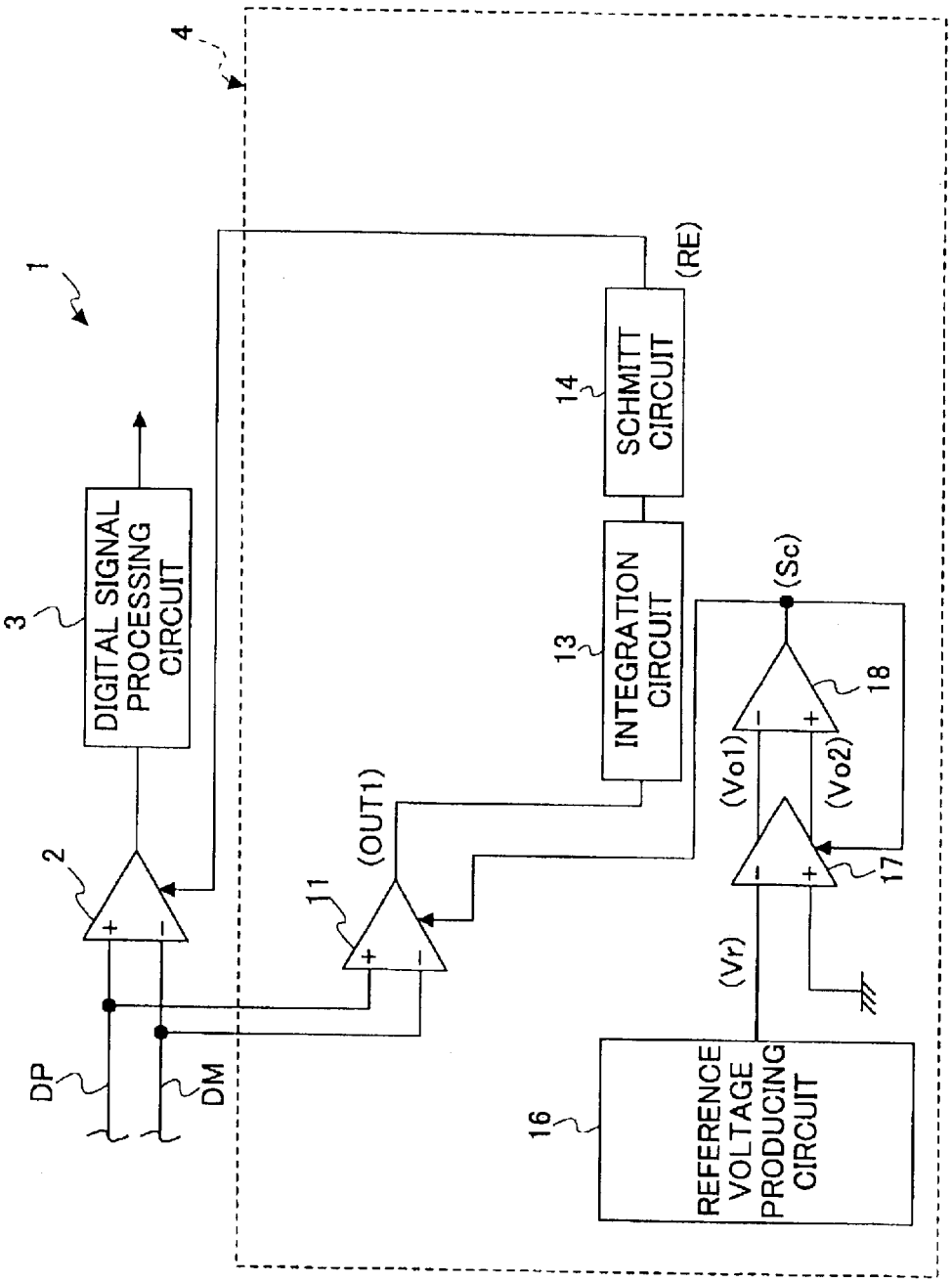
FIG. 12 is a circuit diagram of another example of the serial data detection circuit according to the first embodiment of the present invention.
Figure 13:
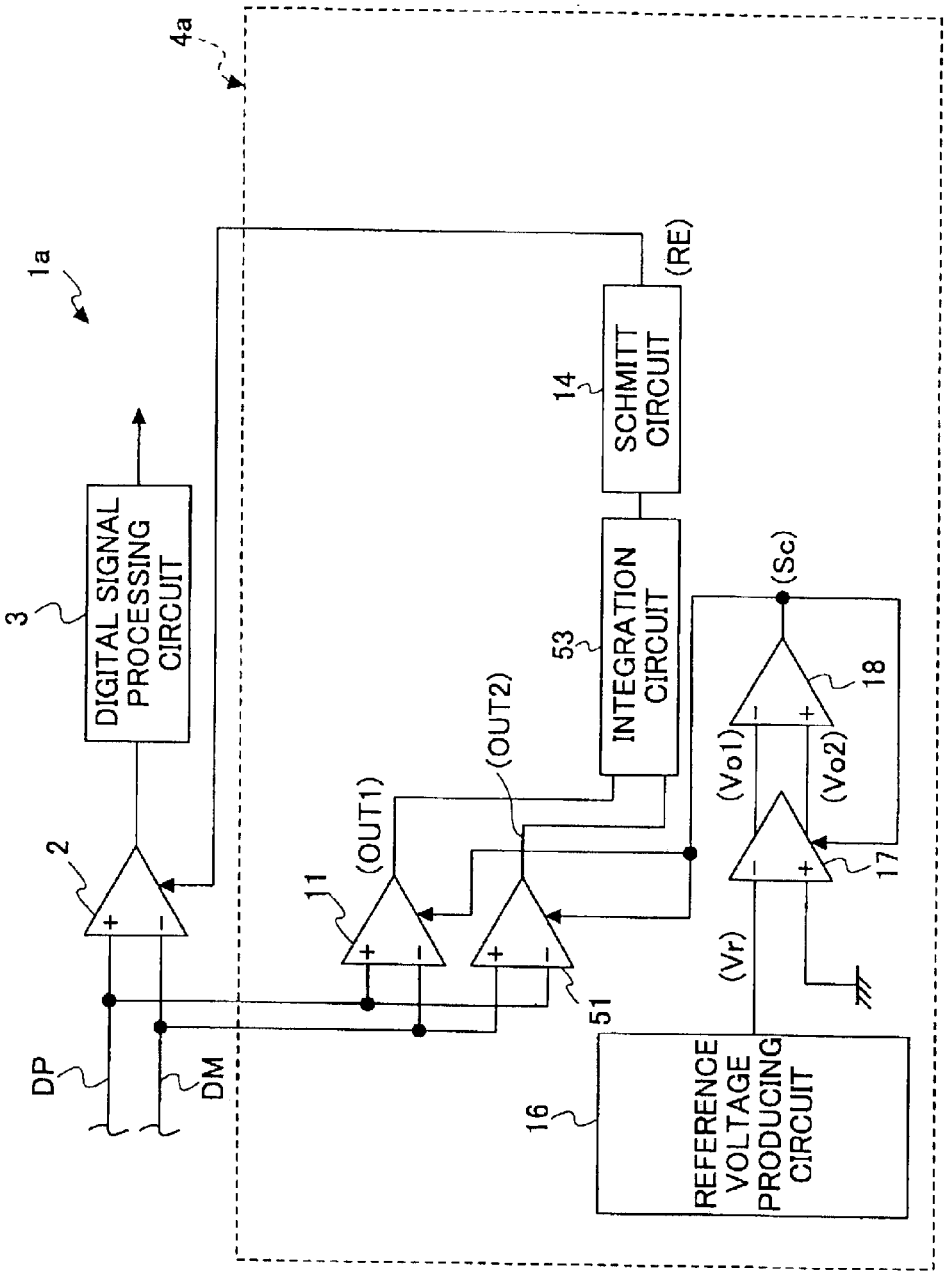
FIG. 13 is a circuit diagram of another example of the serial data detection circuit according to the second embodiment of the present invention.

Additionally, in the foregoing first and second embodiments, the examples of the serial data detection circuits 4 and 4a each use the D flip-flop 12. However, the D flip-flop 12 may not necessarily be used; in this variation, the output signal S1 of the Schmitt circuit 14 is used as the receiver enable signal RE. According to this variation, the received data signal processing device 1 shown in FIG. 5 may be modified to have a circuit configuration shown in FIG. 12, and the received data signal processing device 1a shown in FIG. 9 may be modified to have a circuit configuration shown in FIG. 13. Although these configurations make a time required for detecting serial data signals longer and even susceptible to changes in processes and so forth, the configurations achieve small circuit scales.

The present invention is not limited to the specifically disclosed embodiments, and variations and modifications may be made without departing from the scope of the present invention.

The present application is based on Japanese priority applications No. 2002-045933 filed on Feb. 22, 2002, the entire contents of which are hereby incorporated by reference.

What is claimed is:

1. A serial data detection circuit detecting whether or not a pair of serial data signals having reciprocal signal levels are supplied, the circuit comprising:

a signal detection circuit unit including a differential amplification circuit providing an offset for one serial data signal of said serial data signals, and outputting a predetermined signal indicating a detection of said serial data signals when a voltage of the other serial data signal of said serial data signals becomes larger than a voltage of said one serial data signal provided with said offset;

a differential amplification circuit unit providing an offset for one constant voltage of different predetermined constant voltages supplied thereto, and outputting signals by performing a differential amplification to said constant voltages; and an offset control circuit unit controlling said offset provided by said differential amplification circuit unit so that voltages of said signals output by said differential amplification circuit unit coincide, and correspondingly controlling said offset provided by said differential amplification circuit included in said signal detection circuit unit.

2. The serial data detection circuit as claimed in claim 1, wherein said signal detection circuit unit includes:

a receiver including a differential amplification circuit providing said offset for said one serial data signal, and outputting a binary signal corresponding to a difference between said voltage of said other serial data signal and said voltage of said one serial data signal provided with said offset;

a flip-flop retaining said binary signal, and outputting said binary signal as a signal indicating whether or not said serial data signals are detected; and a reset circuit resetting said flip-flop at an initial value when said binary signal continues to be constant in a predetermined duration.

3. The serial data detection circuit as claimed in claim 2, wherein said reset circuit includes:

an integration circuit integrating said binary signal output by said receiver, and outputting an integrated signal;

a Schmitt circuit converting said integrated signal into a binary signal, and outputting the binary signal; and a reset signal producing circuit producing a reset signal according to a predetermined change in a signal level of said binary signal output by said Schmitt circuit, the reset signal resetting said flip-flop.

4. The serial data detection circuit as claimed in claim 2, wherein said receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in said receiver, and an offset circuit having a same circuit configuration and a same characteristic as said offset circuit included in said receiver.

5. The serial data detection circuit as claimed in claim 1, wherein said signal detection circuit unit includes:

a receiver including a differential amplification circuit providing said offset for said one serial data signal, and outputting a binary signal corresponding to a difference between said voltage of said other serial data signal and said voltage of said one serial data signal provided with said offset;

a serial-in serial-out shift register supplied with said binary signal, and outputting said binary signal as a signal indicating whether or not said serial data signals are detected; and a reset circuit resetting data stored in said shift register at an initial value when said binary signal continues to be constant in a predetermined duration.

6. The serial data detection circuit as claimed in claim 5, wherein said receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in said receiver, and an offset circuit having a same circuit configuration and a same characteristic as said offset circuit included in said receiver.

7. The serial data detection circuit as claimed in claim 5, wherein said reset circuit includes:

an integration circuit integrating said binary signal output by said receiver, and outputting an integrated signal;

a Schmitt circuit converting said integrated signal into a binary signal, and outputting the binary signal; and a reset signal producing circuit producing a reset signal according to a predetermined change in a signal level of said binary signal output by said Schmitt circuit, the reset signal resetting said shift register.

8. The serial data detection circuit as claimed in claim 1, wherein said signal detection circuit unit includes:

a first receiver including a differential amplification circuit providing said offset for said one serial data signal as a first serial data signal, and outputting a binary signal corresponding to a difference between a voltage of said other serial data signal as a second serial data signal and a voltage of said first serial data signal provided with said offset;

a second receiver including a differential amplification circuit providing said offset for said second serial data signal, and outputting a binary signal corresponding to a difference between a voltage of said first serial data signal and a voltage of said second serial data signal provided with said offset;

an OR circuit including input terminals respectively supplied with said binary signal output by said first receiver and said binary signal output by said second receiver;

a flip-flop retaining an output signal of said OR circuit, and outputting said output signal as a signal indicating whether or not said serial data signals are detected; and a reset circuit resetting said flip-flop at an initial value when said output signal continues to be constant in a predetermined duration.

9. The serial data detection circuit as claimed in claim 8, wherein said reset circuit includes:

an integration circuit synthesizing and integrating said binary signal output by said first receiver and said binary signal output by said second receiver, and outputting an integrated signal;

a Schmitt circuit converting said integrated signal into a binary signal, and outputting the binary signal; and a reset signal producing circuit producing a reset signal according to a predetermined change in a signal level of said binary signal output by said Schmitt circuit, the reset signal resetting said flip-flop.

10. The serial data detection circuit as claimed in claim 8, wherein each of said first receiver and said second receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in each of said first receiver and said second receiver, and an offset circuit having a same circuit configuration and a same characteristic as said offset circuit included in each of said first receiver and said second receiver.

11. The serial data detection circuit as claimed in claim 1, wherein said signal detection circuit unit includes:

a first receiver including a differential amplification circuit providing said offset for said one serial data signal as a first serial data signal, and outputting a binary signal corresponding to a difference between a voltage of said other serial data signal as a second serial data signal and a voltage of said first serial data signal provided with said offset;

a second receiver including a differential amplification circuit providing said offset for said second serial data signal, and outputting a binary signal corresponding to a difference between a voltage of said first serial data signal and a voltage of said second serial data signal provided with said offset;

an OR circuit including input terminals respectively supplied with said binary signal output by said first receiver and said binary signal output by said second receiver;

a serial-in serial-out shift register supplied with an output signal of said OR circuit, and outputting said output signal as a signal indicating whether or not said serial data signals are detected; and a reset circuit resetting data stored in said shift register at an initial value when said output signal continues to be constant in a predetermined duration.

12. The serial data detection circuit as claimed in claim 11, wherein said reset circuit includes:

an integration circuit synthesizing and integrating said binary signal output by said first receiver and said binary signal output by said second receiver, and outputting an integrated signal;

a Schmitt circuit converting said integrated signal into a binary signal, and outputting the binary signal; and a reset signal producing circuit producing a reset signal according to a predetermined change in a signal level of said binary signal output by said Schmitt circuit, the reset signal resetting said shift register.

13. The serial data detection circuit as claimed in claim 11, wherein each of said first receiver and said second receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in each of said first receiver and said second receiver, and an offset circuit having a same circuit configuration and a same characteristic as said offset circuit included in each of said first receiver and said second receiver.

14. The serial data detection circuit as claimed in claim 1, wherein said signal detection circuit unit includes:

a receiver including a differential amplification circuit providing said offset for said one serial data signal, and outputting a binary signal corresponding to a difference between said voltage of said other serial data signal and said voltage of said one serial data signal provided with said offset;

an integration circuit integrating said binary signal output by said receiver, and outputting an integrated signal; and a Schmitt circuit converting said integrated signal into a binary signal, and outputting the binary signal as a signal indicating whether or not said serial data signals are detected.

15. The serial data detection circuit as claimed in claim 14, wherein said receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in said receiver, and an offset circuit having a same circuit configuration and a same characteristic as said offset circuit included in said receiver.

16. The serial data detection circuit as claimed in claim 1, wherein said signal detection circuit unit includes:

a first receiver including a differential amplification circuit providing said offset for said one serial data signal as a first serial data signal, and outputting a binary signal corresponding to a difference between a voltage of said other serial data signal as a second serial data signal and a voltage of said first serial data signal provided with said offset;

a second receiver including a differential amplification circuit providing said offset for said second serial data signal, and outputting a binary signal corresponding to a difference between a voltage of said first serial data signal and a voltage of said second serial data signal provided with said offset;

an integration circuit synthesizing and integrating said binary signal output by said first receiver and said binary signal output by said second receiver, and outputting an integrated signal; and a Schmitt circuit converting said integrated signal into a binary signal, and outputting the binary signal as a signal indicating whether or not said serial data signals are detected.

17. The serial data detection circuit as claimed in claim 16, wherein each of said first receiver and said second receiver includes the differential amplification circuit supplied with said serial data signals at respective input terminals, and an offset circuit adding an offset current to a current output from one of transistors forming a differential pair included in said differential amplification circuit according to a control signal supplied from said offset control circuit unit, and said differential amplification circuit unit includes a differential amplification circuit having a same circuit configuration and a same characteristic as said differential amplification circuit included in each of said first receiver and said second receiver, and an offset circuit having a same circuit configuration and a same characteristic as said offset circuit included in each of said first receiver and said second receiver.

18. A received data signal processing device provided in a high-speed serial communication system using a USB and so forth, the device comprising:

a receiver circuit converting a pair of serial data signals supplied from serial transmission lines, the serial data signals having reciprocal signal levels, into a digital signal, and outputting the digital signal;

a digital signal processing circuit applying a predetermined process to said digital signal, and outputting a processed signal; and a serial data detection circuit detecting whether or not said serial data signals are supplied, and causing said receiver circuit to operate upon detecting that said serial data signals are supplied, the serial data detection circuit including:

a signal detection circuit unit including a differential amplification circuit providing an offset for one serial data signal of said serial data signals, and outputting a predetermined signal indicating a detection of said serial data signals when a voltage of the other serial data signal of said serial data signals becomes larger than a voltage of said one serial data signal provided with said offset;

a differential amplification circuit unit providing an offset for one constant voltage of different predetermined constant voltages supplied thereto, and outputting signals by performing a differential amplification to said constant voltages; and an offset control circuit unit controlling said offset provided by said differential amplification circuit unit so that voltages of said signals output by said differential amplification circuit unit coincide, and correspondingly controlling said offset provided by said differential amplification circuit included in said signal detection circuit unit.

* * * * *